US010198536B2

United States Patent
Rathgeb et al.

(10) Patent No.: US 10,198,536 B2
(45) Date of Patent: Feb. 5, 2019

(54) SIMULATION SYSTEM, METHOD FOR CARRYING OUT A SIMULATION, CONTROL SYSTEM, AND COMPUTER PROGRAM PRODUCT

(75) Inventors: Andreas Rathgeb, Poxdorf (DE);
Rainer Speh, Weiterstadt (DE);
Michael Unkelbach, Buckenhof (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 1085 days.

(21) Appl. No.: 14/123,976

(22) PCT Filed: Jun. 5, 2012

(86) PCT No.: PCT/EP2012/060558
§ 371 (c)(1),
(2), (4) Date: Feb. 24, 2014

(87) PCT Pub. No.: WO2012/168215
PCT Pub. Date: Dec. 13, 2012

(65) Prior Publication Data
US 2014/0172403 A1     Jun. 19, 2014

(30) Foreign Application Priority Data
Jun. 9, 2011   (DE) .................. 10 2011 077 319

(51) Int. Cl.
*G06F 9/44*      (2018.01)
*G06F 17/50*     (2006.01)
*G05B 17/02*     (2006.01)

(52) U.S. Cl.
CPC ......... *G06F 17/5009* (2013.01); *G05B 17/02* (2013.01); *Y02P 90/265* (2015.11)

(58) Field of Classification Search
None
See application file for complete search history.

(56) References Cited

U.S. PATENT DOCUMENTS 3,903,403 A * 9/1975 Ferguson ................. G09B 9/00
376/217
2005/0102126 A1* 5/2005 Tanaka ................... G05B 17/02
703/18
(Continued)

FOREIGN PATENT DOCUMENTS

CN       1497441 A     5/2004
CN    101154322 A     4/2008
(Continued)

OTHER PUBLICATIONS

Hoyer et al. An Approach for Integrating Process and Control Simulation into the Plant Engineering Process European Symposium on Computer Aided Process Engineering—15, 2005 Elsevier Science B.V.*
(Continued)

*Primary Examiner* — Aniss Chad
*Assistant Examiner* — Cuong V Luu
(74) *Attorney, Agent, or Firm* — Beusse Wolter Sanks & Maire

(57) ABSTRACT

A simulation system in particular for a control system which controls a process running in a technical system is provided. The control system has at least one first process environment embodied as a container and which is also designed to simulate the automatic process to be run in the system and includes corresponding interfaces to the guidance system. The simulation system includes, in addition to the first process environment, a second process environment embodied as a container for simulating the hardware of the periphery of the guidance system and a third process environment embodied as a container for simulating the process to be run in the technical system. In another embodiment, all process environments can also be combined to form one process environment. In both variations, the interfaces of the first process environment and the interfaces of the second pro- (Continued)

cess environment are practically identical to the interfaces of the third process environment. A method for carrying out a simulation, a corresponding control system, and computer program product are also provided.

16 Claims, 3 Drawing Sheets

(56) References Cited

U.S. PATENT DOCUMENTS

| | | | | |
|---|---|---|---|---|
| 2007/0132779 | A1* | 6/2007 | Gilbert | G05B 19/0426 345/619 |
| 2008/0027704 | A1* | 1/2008 | Kephart | G05B 19/41885 703/22 |
| 2008/0046227 | A1 | 2/2008 | Flamingo | |
| 2008/0077370 | A1 | 3/2008 | Frick | |
| 2008/0147209 | A1* | 6/2008 | Landgraf | G05B 17/02 700/29 |
| 2009/0089031 | A1* | 4/2009 | Sturrock | G05B 17/02 703/7 |
| 2009/0132060 | A1* | 5/2009 | Jenks | G05B 17/02 700/7 |
| 2009/0312850 | A1* | 12/2009 | Higuchi | G05B 17/02 700/29 |
| 2010/0070255 | A1* | 3/2010 | Biltz | G06F 11/261 703/13 |
| 2011/0087977 | A1* | 4/2011 | Campney | G05B 19/0426 715/763 |
| 2012/0173221 | A1 | 5/2012 | Lodes | |
| 2013/0191106 | A1* | 7/2013 | Kephart | G05B 17/02 703/21 |
| 2014/0172403 | A1 | 6/2014 | Rathgeb et al. | |
| 2017/0098022 | A1* | 4/2017 | Kephart | G06F 17/5009 |

FOREIGN PATENT DOCUMENTS

| | | |
|---|---|---|
| CN | 100465840 C | 3/2009 |
| DE | 10347078 A1 | 4/2004 |
| DE | 102009055810 A1 | 5/2011 |
| DE | 102011077319 B4 | 12/2012 |
| EP | 1857896 A1 | 11/2007 |
| EP | 1906377 A1 | 4/2008 |
| EP | 1933214 A2 | 6/2008 |
| WO | 2006003198 A2 | 1/2006 |
| WO | 20100149433 A1 | 12/2010 |

OTHER PUBLICATIONS

CN Office Action dated Nov. 3, 2016, for CN patent application No. 201280028176.7.
Thorsten Carrels et al, A Generic Approach for the Simulation of Distributed Control Systems using J2EE Technology; Industrial Informatics 2007.

* cited by examiner

SIMULATION SYSTEM, METHOD FOR CARRYING OUT A SIMULATION, CONTROL SYSTEM, AND COMPUTER PROGRAM PRODUCT

CROSS REFERENCE TO RELATED APPLICATIONS

This application is the US National Stage of International Application No. PCT/EP2012/060558 filed Jun. 5, 2012, and claims the benefit thereof. The International Application claims the benefit of German Application No. DE 102011077319.3 filed Jun. 9, 2011. All of the applications are incorporated by reference herein in their entirety.

FIELD OF INVENTION

The invention relates to a simulation system, in particular for a control system which controls a process running in a technical installation, the control system comprising at least one first execution environment which is in the form of a container, is designed to simulate the automation process on which the installation is based and has corresponding interfaces to the control system. The invention also relates to a method for carrying out a simulation using the simulation system according to the invention. A corresponding control system and a computer program product are also stated.

BACKGROUND

In large-scale technical installations, for example power plants, training simulators are being increasingly used in order to train control room personnel for operation of the power plant and in order to train them for exceptional situations and critical operating states which may occur during actual operation of the power plant. However, simulators are also used for test purposes during the engineering of a technical installation in order to make it possible for a project engineer to find optimal solutions for the connection of functions inside the technical installation or to detect faults before the installation is implemented and thus to shorten start-up.

A simulator is generally a computer system in which processes of a technical installation can be carried out or illustrated under realistic conditions.

In the power plant sector, for example, a power plant is, in principle, simulated in the simulator as software. In order to simulate the operation of a power plant as realistically as possible on a computer, it is necessary to simulate both the process engineering process, which runs in an actual power plant and affects the operating behavior and interaction of the power plant components, and the automation engineering process, which comprises the process control system used for operation and control with its automation and operation and observation components, with the aid of complex software. The simulator accordingly behaves in an identical manner to the actual power plant. If the power plant is run with a particular control system, for example the Siemens SPPA-T3000 control system, all details on the simulator screen correspond to those from the control room of the actual installation.

Simulation computers which are independent of the control system, that is to say are a separate computer system, are usually used to simulate power plants. The effort required for this usually requires a gigantic computer power of the simulation computer used. The hardware for the simulation computer must be constructed, installed and maintained at each place of use.

Nowadays, there are two different simulator approaches (cf. also description of FIG. 1A): simulators in which the operating and observation system of the original control system is used, and simulators which also concomitantly simulate the operating and observation system of the control system, that is to say the entire user interface—however, this is very complicated and the results are generally also unsatisfactory. This solution is usually only used in older control systems, for example if the operating and observation system cannot be simulated because there is no simulator time support, for example.

There are often simulators which have separate computers for the hardware, which is the automation servers of the control system and the hardware connected to the control system such as I/O subassemblies, motors, valves etc., and for the physical process on which the technical installation is based (cf. also description of FIG. 1A).

In both cases, the software, like the hardware of the simulators, is decoupled from the control system. Parts of the original software engineering data relating to the automation of the control system are often used, that is to say the inputs for the simulation software receive values from the control system which are written, however, to software separate from the control system. Furthermore, the configuration of these simulators is very complex (sometimes not accessible at all to the user in the case of process simulators) and is carried out using configuration tools of a completely different type to those of the control system. A consistency check between simulators and the control system does not take place. In addition, the configuration of simulators generally does not take into account the engineering data relating to the cabling or wiring of connected hardware (sensors, actuators).

SUMMARY OF THE INVENTION

Therefore, an object herein is to specify a simulation system, as a result of which the simulation becomes an integral part of a control system. An object is also to specify a control system with an integrated simulation system. Another object is to specify an improved simulation method. In addition, the intention is to specify a corresponding computer program product embodied on a non-transitory computer readable medium.

These objects are achieved by the features of the independent patent claim. Advantageous refinements are respectively described in the dependent patent claims.

In an embodiment, the simulation system herein comprises execution environments for automation, for simulating the hardware of the peripherals of the control system and for simulating the process running in the technical installation. All execution environments have the same interfaces and are connected to the bus system via these interfaces.

The execution environments may also merge to form a single execution environment. In addition, each execution environment may itself be a software component. Inside the execution environments and software components, there are embedded software components as representatives of functions, subassemblies, devices and computational models or other computation units of the process.

As a result of the simulation system herein, the automation function itself, the simulation of the hardware of the peripherals of the control system and the simulation of the process on which the technical installation is based are incorporated in the software of the control system. In a control system having a universally usable execution environment for software components, this execution environment may now be used both in the normal control system in real time for the automation of a power plant, for example, and in other entities in order to simulate the automation, the hardware and the process. The simulation of the entire automation operation and of the hardware of the peripherals of the control system and the process simulation advantageously take place here in one entity. For this purpose, the module library only needs to be expanded with simulation modules for the hardware of the peripherals of the control system and possibly with process simulation modules for the process.

In this manner, the control system and the simulator merge, in terms of software and therefore also in terms of computer technology, to form a unit, which entails numerous advantages:

The simulation system is configured using the same engineering or planning tools as the configuration of the control system.

The simulation system is planned with graphical tools using modular technology, just like the planning of the actual installation inside the control system.

As a result of the use of the same tools for configuration and planning, a consistency check between the automation and simulation is possible for the first time.

All functions of the control system can therefore be ensured with the greatest degree of reliability.

A result is a simplified simulation system for training and test purposes. This results in reduced downtimes during operation of a technical installation, shortening and improvements during start-up and improved simulation quality since there is consistency within the entire simulator solution and everything runs on one platform.

Some of the terms used in this application are explained below in order to ensure the same understanding:

A program includes software code that can be directly executed on an operating system and which is closed to the outside, with the result that communication with other software components takes place only via exactly defined interfaces to other software components, is generally referred to as a software component. An embedded software component is a software component which is embedded in another software component. Although it is likewise closed to the outside and communicates only via exactly defined interfaces to other software components, it is not directly executed on the operating system but rather in the environment of the software component surrounding it.

A program includes directly executable software code, has at least one interface to an embedded software component and at least one interface to the operating system and is directly executable on the operating system is referred to as a container in computer science. A container which, for its part, is in the form of a software component and forms a universally usable execution environment for one or more embedded software components is referred to as an "execution container" below. The execution container is therefore, on the one hand, a coupling element between any desired embedded software component and the operating system and makes it possible for the embedded software component to run on the computer. On the other hand, it also facilitates and manages, in its property as a software component, communication between the embedded software components and other software components outside the container by means of external interfaces.

In this context, an entity should be understood as meaning the specific use of a type of software component in the system.

BRIEF DESCRIPTION OF THE DRAWINGS

The invention is explained in more detail below using exemplary embodiments which are illustrated in the drawings, in which.

DETAILED DESCRIPTION

Figure 1A:
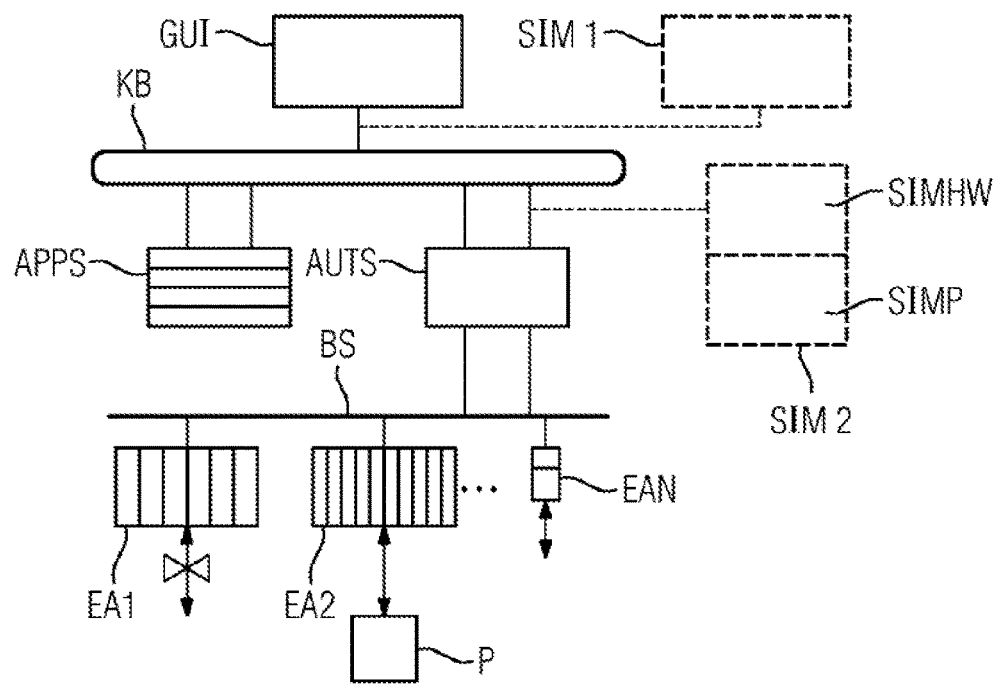
FIG. 1A shows a block diagram of a possible implementation of a control system of a technical installation with its hardware components (prior art)

FIG. 1A illustrates, in a simplified form, the block diagram of a possible implementation of a control system of a technical installation. Only the hardware is shown in this illustration. The underlying physical process to be controlled using the control system is illustrated by the box P. This may be, for example, a process for producing energy in a power plant, refuse incineration or a chemical process. In principle, the process on which the technical installation is based may be a physical, chemical, biological or other technical process. The signals recorded using sensors are forwarded to input and output subassemblies EA1, EA2 to EAN. These may be pure input/output subassemblies or else intelligent field devices. At the same time, control signals are also forwarded to the field devices in the process via the subassemblies EA1, EA2 to EAN. The bidirectional signal flow is illustrated by the arrows. The subassemblies EA1, EA2 to EAN are connected, on the side remote from the process, to an external or internal bus system BS which collects the signals and forwards them, for example, to at least one automation server AUTS. The subassemblies EA1 to EAN may also be intelligent field devices in which the sensor and/or actuator is/are integrated together with processing logic in a device which is directly connected to the automation server AUTS via the bus system BS. The automation server AUTS in turn—as stated in this example—may be connected to at least one application server APPS via a communication bus KB. For reasons of availability, any connections between the servers and buses are generally usually redundant, which is indicated by the double connecting lines. Any desired user interface is also connected to the communication bus KB. This is any desired graphical user interface GUI. These may be thin clients, for example. GUI should be understood here as meaning any operating and observation systems, engineering clients or other display systems.

As already stated in the introduction, prior simulation systems are usually designed in such a manner that either a very powerful computer which simulates the entire user interface GUI of the control system (as indicated by the box SIM1 in the figure) is provided or a separate simulation computer SIM2 rather than the automation server AUTS is accessed via the user interface GUI of the control system. The latter solution may also be implemented by means of two computers, for example by means of a computer SIMHW, which simulates the hardware of the underlying automation process, and by means of a computer SIMP which simulates the underlying process.

Figure 1B:
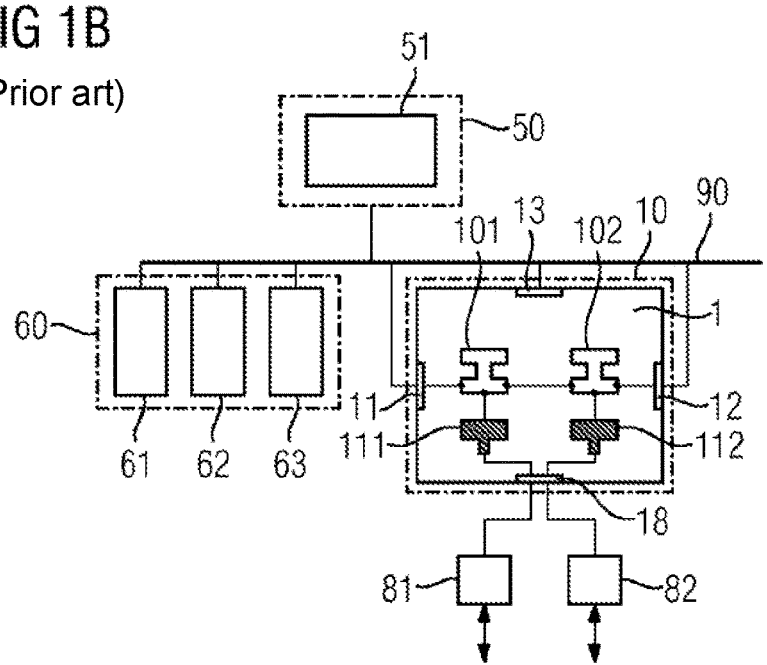
FIG. 1B shows a schematic illustration of the control software of an exemplary control system (prior art)

FIG. 1B illustrates a possible embodiment variant for the software architecture of an exemplary control system as described in FIG. 1A using the hardware. In this exemplary embodiment, the control technology software has been reduced to a few components in order to ensure a better overview: the basic functions which can be mentioned here are presentation software 51 which makes it possible to present a wide variety of operational images. This may be, for example, a web browser which runs on a thin client. The execution environment is denoted by 50. There are also numerous software modules, for example 61, 62 and 63, which are responsible, for example, for engineering the installation, archiving data, message management or resource management. All of these software modules therefore perform different functions. They may run in a separate execution environment which is denoted by 60 here. All of the software modules are connected to one another, that is to say data can be interchanged between all modules.

The automation function of the control system is illustrated in this exemplary embodiment by separate software. This is an execution container 10, that is to say a container which, for its part, is in the form of a software component 1 and forms a universally usable execution environment for one or more embedded software components 101, 102, 111 and 112. The execution container 10 manages and carries out all existing automation functions including the processing functions. The execution container 10 typically has a plurality of interfaces. An interface is used to mean a data interface below. This may be, for example, an interface 13 for the engineering or the interfaces 11 and 12 which are connected to the remaining control technology, inter alia also to other entities of an execution environment. In addition, interfaces for diagnosis, for particular messages or for operation may be provided. Embedded software components 101 and 102 are illustrated inside the execution container 10 in FIG. 1B. Said software components in turn have internal standardized interfaces which are illustrated as dots. The embedded software components 101 and 102 contain main functions such as all automation tasks, control operations, regulating operations, calculations, processing functions, alarm management and execution management.

Furthermore, so-called representative modules 111 and 112 are illustrated inside the execution container 10. The representative modules substantially represent existing hardware components, for example an input or output subassembly. Their software is illustrated by 81 and 82 here. The representative modules 111 and 112 ensure that the input raw data are connected to/from the field devices and monitor them and are therefore responsible for communicating with the field devices. The bus interface 18 is used for this connection. This interface of the execution container 10 leads to an automation bus (bus interface to the bus system BS) via which the input and output subassemblies and the intelligent field devices are connected to the automation server. The representative modules 111 and 112 inside the execution container 10 communicate with the input and output subassemblies (and intelligent field devices) which are indeed outside the automation server (and therefore outside the execution container 10) via this interface. Depending on the design, the automation bus may be, for example, a Profibus, a Modbus, another serial bus or else an Ethernet-based bus (for example Profinet or pure TCP/IP or UDP-based communication).

During ongoing operation of the control system, the software component 1 and therefore also the software components 101, 102 and representative modules 111 and 112, which are embedded inside 1 and are connected via their internal interfaces in such a manner that the entire automation process is implemented, are executed.

Figure 2:
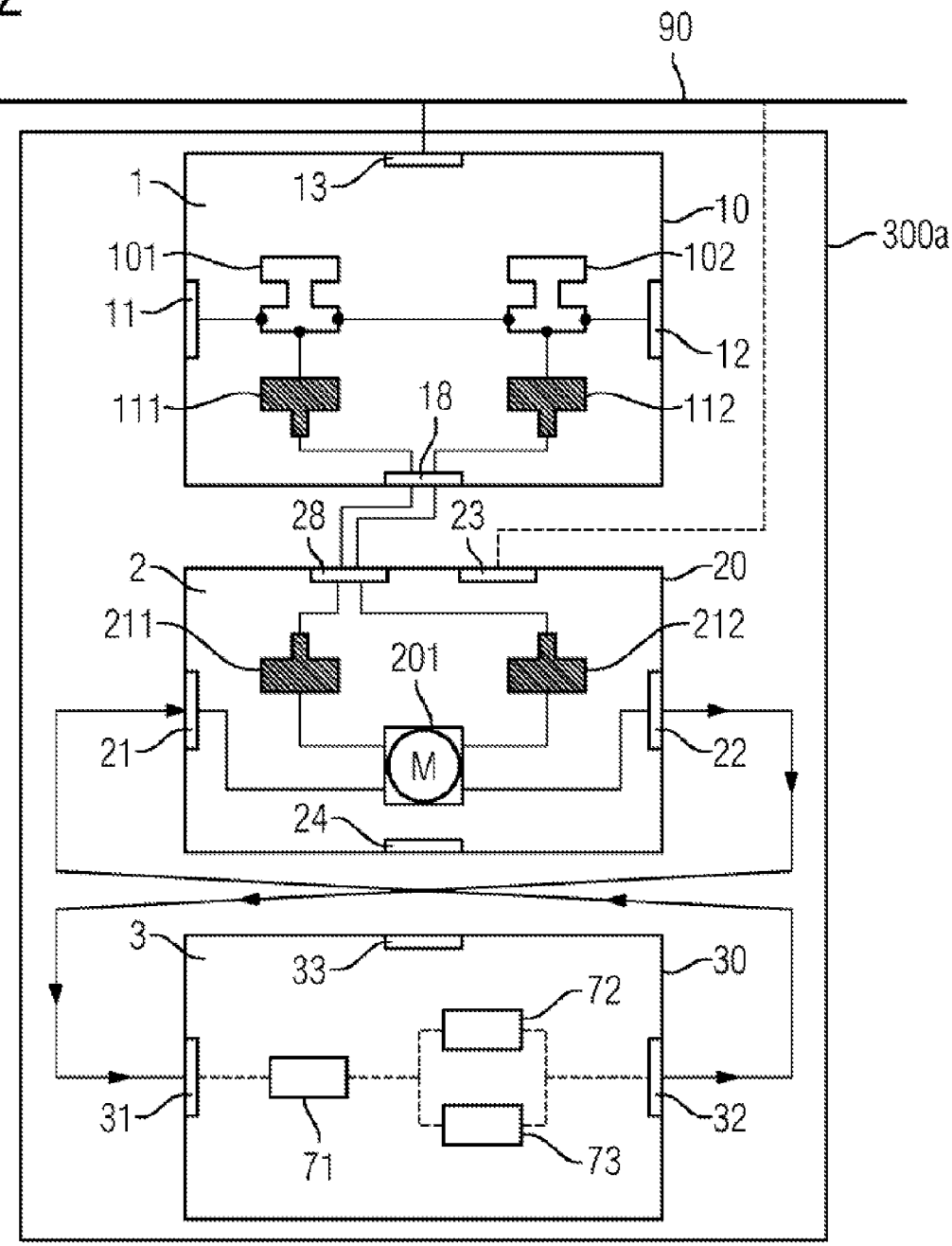
FIG. 2 shows a schematic illustration of a first embodiment variant of the simulation system.
Figure 3:
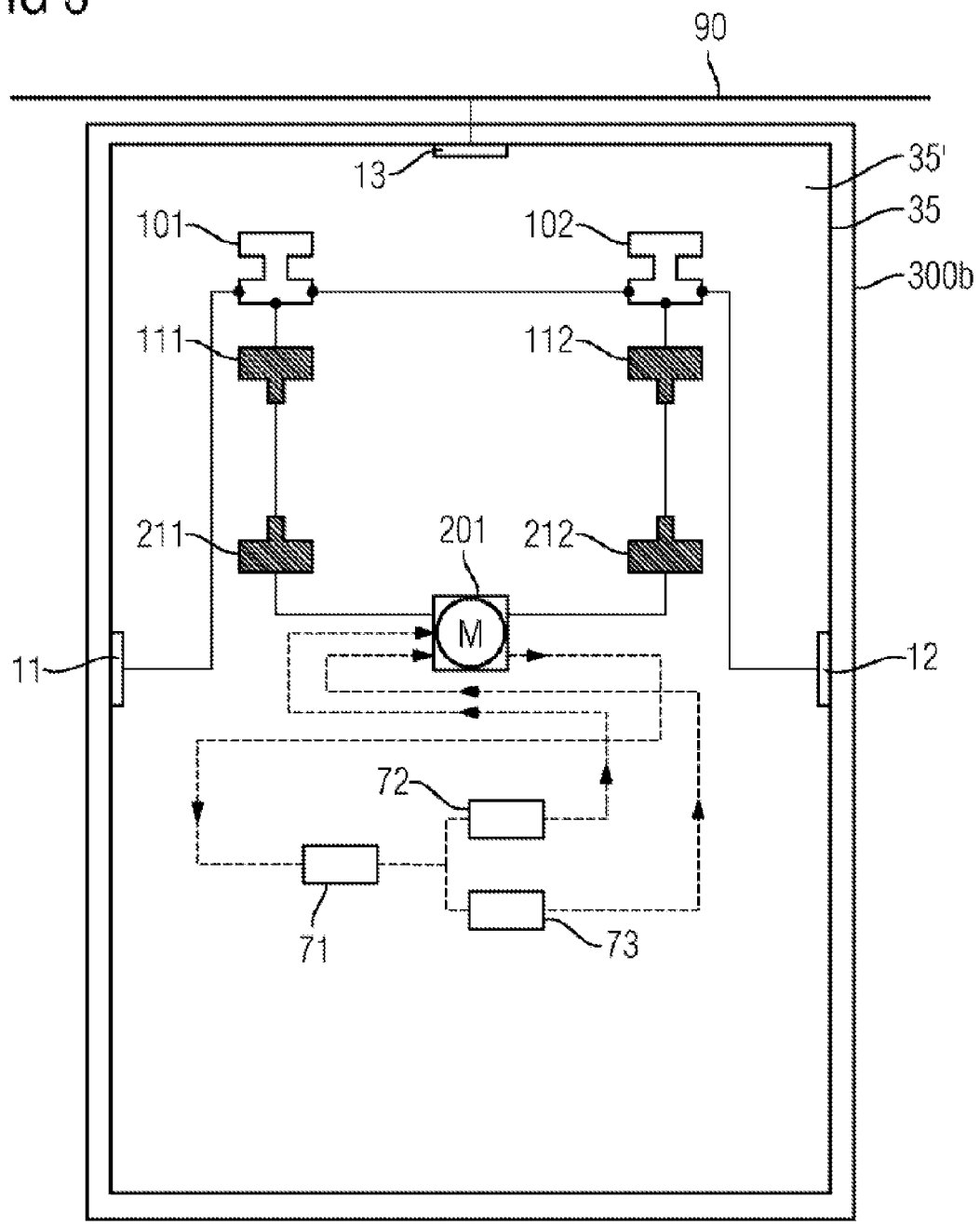
FIG. 3 shows a schematic illustration of a second embodiment variant of the simulation system.

FIGS. 2 and 3 illustrate embodiment variants of the simulation system herein. This is respectively software architecture which can be directly combined with the architecture shown in FIG. 1B and is connected to the latter.

In the exemplary embodiment 300a illustrated in FIG. 2, the simulation system comprises three execution environments. In the exemplary embodiment 300b illustrated in FIG. 3, all execution environments have been combined to form a single execution environment and the simulation system 300b comprises only this one execution environment here.

In this first exemplary embodiment in FIG. 2, the simulation system 300a comprises, in addition to the execution environment 10 for the automation function described in FIG. 1B, a further execution environment 20, which simulates the hardware of the peripherals of the control system with all of its connections in software, and a process simulator, here in the form of an execution environment 30. So-called representative modules 211 and 212 which represent the control system peripherals which are connected, for example, directly to the bus system from FIG. 1A are embedded in the execution environment 20. These may be, for example, subassemblies, other bus connection modules, intelligent field devices such as actuators (actuating drives, motor controllers) and sensors or else communication modules for third-party systems. The software component 201 simulates, for example, the behavior of an actuating drive with open or close commands and corresponding feedback or simulates the behavior of the withdrawable part of the switchgear for a motor of a process engineering component. For this purpose, the software modules 201, 211, 212 each have internal interfaces via which, for example, physical variables or other data and parameters can be interchanged. The connecting lines between the individual modules and interfaces represent this signal interchange which is carried out in the actual installation using existing cables/wires in the control system or by means of data transmission in field bus systems, for example. (Depending on the wiring or cabling variant, clamping points may also be included, for example, as distributors or repeaters on the field bus. These components are not illustrated in the diagram for the purpose of simplification). The representative modules 211 and 212 are formed inversely to representative modules 111 and 112. In this case, inversely means that inputs and outputs of the respective interfaces have been swapped. Whereas a representative module of the type 111 and 112 generally ensures that the input raw data are connected to/from the control technology interface, a representative module of the type 211 and 212 already simulates a subassembly and is therefore responsible for converting the field data into the input raw data for higher software modules.

The entire execution environment 20 can now be in the form of an execution container according to the container definition described above or may be in the form of a software component 2. In both cases, there are a particular number of external interfaces, for example 21, 22 and 23, which make it possible to communicate with the other program parts of the control system. Like the interface 13 of the first execution environment 10 responsible for automation, the interface 23 may be responsible for filling the container with engineering data and may be connected to the component bus 90. The software components 1 and 2 and the execution environments 10 and 20 can communicate via the interfaces 18 and 28. Depending on the type of bus, the interface 28 is either identical to the interface 18 (generally for Ethernet-based bus systems) or, depending on the bus system, provides the complementary interface to the interface 18 (generally for serial bus systems with a master/slave functionality). In addition, there may be a further interface 24 which allows connection to the process. This interface 24 can be used to transmit process data which are transmitted from a process simulator, i.e. a simulation computer responsible for the technical process.

In this case, the process simulator comprises the execution environment 30 which simulates the process on which the technical installation is based in software. The process on which the technical installation is based may be a physical, chemical, biological or other technical process. In FIG. 2, the process simulator is in the form of a separate execution environment 30 and/or a separate software component 3, for example. The software architecture of the process simulator would therefore be in accordance with the architecture of the execution environments 10 and 20 and the software components 1 and 2 and would facilitate integration into the control system. In a similar manner, the process simulator would contain, in this case, a multiplicity of embedded software components, for example 71, 72 and 73, which represent a physical model of the technical installation, for example. The software components 71, 72 and 73 could also contain other calculation modules. In a power plant, the underlying process is the production of energy by burning coal dust, for example, with the supply of air and with the production of flue gas. Steam is also produced and is brought to different temperatures in order to drive a turbine which is used to produce electrical current. The simulation of each of these process steps may be accommodated in software components, for example. The material flows and process signals would then be transmitted via the interfaces. The connecting lines depicted using dashed lines between the individual modules 71, 72 and 73 and the interfaces 31 and 32 represent the interchange of process signals and, in contrast to the solid lines, do not represent wire connectors.

According to an embodiment, the interfaces 11, 12, 13 of the automation function, i.e. the execution environment 10, and the interfaces 21, 22, 23 of the execution environment 20 are virtually identical to the interfaces 31, 32, 33 of the execution environment 30. This means that the containers 10, 20 and 30 communicate via the same interface which leads to the control system. The interfaces 11, 12, 13, 21, 22 and 23 are designed in exactly the same manner, in terms of their function and physically, as the interfaces 31, 32 and 33. Minor changes for adaptation to particular boundary conditions may be possible.

In principle, a plurality of variants of the connection of the execution environments are possible. The execution environment 10 may be connected to the execution environment 20, for example as shown in FIG. 2, via special interfaces, such as the connection between the bus interface 18 and the interface 28, or by implementing interfaces via a connection between the interfaces 11 and 12 and the interfaces 21 and 22. The execution environment 30 responsible for the process simulator may likewise be directly connected to the execution environment 20 responsible for simulating the hardware peripherals via various interfaces. On the one hand, the process simulator 30 may be connected, via an interface 33 additionally provided for this purpose, to an interface 24 of the hardware simulator, which is likewise additionally provided for this purpose. On the other hand, the process simulator 30 may be connected by converting the interfaces 21 and 22 of the hardware simulator to interfaces 31 and 32 of the process simulator.

In a second embodiment variant 300*b* for the simulation system, which is illustrated in FIG. 3, the execution environments 10, 20 and 30 have been combined to form a single execution environment 35. Automation simulation, hardware simulation and process simulation take place in one entity. Embedded software components and representative modules of the individual software components 1, 2 and 3 are now executed in an execution environment 35. In addition, the newly formed execution environment 35 may itself be a software component 35'. Previously container-encompassing connections between the embedded components and modules from previously 10, 20 and 30 now become container-internal connections. Previously external interfaces now become internal interfaces (included in the container) or may be completely omitted. In this case too, the connecting lines depicted using dashed lines, for example between the individual modules 71, 72 and 73, represent the interchange of process signals and, in contrast to the solid lines, do not represent wire connectors. In this embodiment variant, the simulation system 300*b* now consists of only one execution environment. At least the interfaces 11 and 12 are now available for communication with the control system. A further interface 13 which allows the container to be filled with engineering data from the bus system 90 is also additionally provided here.

The control system or parts of the latter is/are now simulated as follows:

The first execution environment 10 is produced using a planning tool of the control system.

The second and third execution environments 20 and 30 with all embedded software components, for example 201, the representative modules 211, 212 and connections are likewise produced using the planning tool of the control system previously used for the first execution environment. Modules of the type 211, 212 may even be automatically generated.

The execution environment 10 or parts of the latter, which is/are designed to simulate the automation process on which the installation is based with its connections, is/are executed and therefore control(s) the installation.

Irrespective of the events in the actual installation, the execution environments 20 and 30 are executed either separately or together in parallel with the execution environment 10, in which case the technical installation or parts of the technical installation is/are simulated.

The invention claimed is:

1. An integrated system that provides both normal control for a technical installation in real time and also provides simulation, the integrated system comprising:
   execution containers that provide a coupling element between one or more embedded software components and an operating system where the embedded software components run on a computer as a universally usable execution environment and provide communication between the embedded software components and other software components outside the execution container by communication interfaces:
   a control system which controls a physical process running in a technical installation in real time, the control system comprising:
   an automation server having an operating system; and
   an I/O bus system connecting the automation server with a plurality of input and output subassemblies and devices that send and receive signals between the automation server and an underlying physical process being controlled outside the automation server, said signals including actual process variables from the technical installation;

wherein the automation server comprises a first execution environment which is in the form of a first execution container, and is designed to operate in a normal mode for implementation of the automation process on which the installation is based during operation of the control system, and also designed for a simulation mode, and wherein the first execution environment has corresponding first interfaces, including an I/O interface that leads to the I/O bus system during normal operation, and other communication interfaces to communicate with other program parts of the control system, and a simulation system integrated with and running on the same platform as the control system, wherein the simulation system comprises three execution environments, (a) the first execution environment of the control system further adapted as an automation process simulator for simulation of the automation process, (b) a second execution environment which is in the form of a second execution container, and is designed as a hardware simulator to simulate the hardware of the peripherals and input and output subassemblies and devices of the control system with its connections and has second interfaces, and (c) a third execution environment which is also in the form of a third execution container, and is designed as a process simulator to simulate the physical process on which the installation is based and has corresponding third interfaces, wherein one or more of the third interfaces connect to one or more respective second interfaces to transmit process data from the process simulator to the hardware simulator, wherein the first, second, and third interfaces are functionally and physically identical to each other, the architecture of the three executions environments are the same and are all produced using the same engineering tool as used in the configuration of the control system to facilitate integration into the control system, and wherein connections of the first execution environment are adapted to be changed from the normal mode to the simulation mode by connecting at least one of the first interfaces of the first execution environment to at least one of the second interfaces of the second execution environment.

2. The integrated system as claimed in claim 1, wherein the first, second, and third execution environments comprise software components, and wherein a module library is expanded with simulation modules for the hardware of the peripherals and with process simulation modules for the process.

3. The integrated system as claimed in claim 1, wherein communication between the first execution environment and the second execution environment is carried out via bus interfaces.

4. The integrated system as claimed in claim 1, wherein the first, second, and third execution environments comprise embedded software components and representative modules which are connected to one another according to a function, and wherein the software components and representative modules are executed when this function is called.

5. The integrated system as claimed in claim 4, wherein the second execution environment comprises embedded software components and representative modules for the subassemblies and devices, including their networking or wiring in the peripherals of the control system.

6. The integrated system as claimed in claim 5, wherein the interfaces of the representative modules of the second execution environment are formed in such a manner that they simulate the interfaces of the inputs and outputs of the wire connectors of the control system.

7. The integrated system as claimed in claim 4, wherein the representative modules of the second execution environment are formed inversely to representative modules of the first execution environment, with inputs and outputs of the interfaces being swapped.

8. The integrated system as claimed in claim 1, wherein both actual process variables and predefined or simulated variables are supplied to the representative modules of the second execution environment.

9. The integrated system as claimed in claim 1, wherein the third execution environment contains embedded software components which are used to implement a physical model of the technical installation.

10. A method for integrating a simulation system into a control system to form an integrated system as claimed in claim 1, the method comprising:

providing execution containers that provide a coupling element between one or more embedded software components and an operating system where the embedded software components run on a computer as a universally usable execution environment and provide communication between the embedded software components and other software components outside the execution container by communication interfaces, producing the first execution environment as the first execution container for automation process implementation for operation of the control system with its embedded software components, representative modules and first interfaces using an engineering tool of the control system, producing the hardware simulator as the second execution environment in the form of a second execution container with its embedded software components, representative modules and second interfaces using the engineering tool of the control system previously used for the first execution environment, producing and configuring the process simulator as the third execution environment in the form of a third execution container with its embedded software components, representative modules and third interfaces using the engineering tool of the control system, wherein the architecture of the three executions environments are the same, connecting one or more of the third interfaces to one or more respective second interfaces to transmit process data from the process simulator to the hardware simulator, further adapting the first execution environment to simulate the automation process on which the installation is based so that its interfaces are changeable to a simulation mode without changing the existing planning, wherein the adapting includes connecting at least one of the first interfaces of the first execution environment to at least one of the second interfaces of the second execution environment, wherein the simulation system is designed such that the technical installation or parts of the technical installation is/are then simulated in the first, second, and third execution environments on the same platform as the control system.

11. The method as claimed in claim 10, wherein the planning of hardware of the second execution environment is automatically produced from the hardware planning of the installation.

12. The method as claimed in claim 10, wherein the simulation system is graphically planned using modular technology.

13. A computer program product embodied on a non-transitory computer readable medium which is loaded into the memory of a computer and comprises software code sections which are used to carry out the method as claimed in claim 10 when executed on a computer.

14. An integrated system that provides both normal control for a technical installation in real time and also provides simulation, the integrated system comprising:
   an execution container that provides a coupling element between one or more embedded software components and an operating system where the embedded software components run on a computer as a universally usable execution environment, and that provides communication between the embedded software components and other software components outside the execution container by communication interfaces,
   a control system which controls a physical process running in a technical installation in real time, the control system comprising:
   an automation server having an operating system; and
   an I/O bus system connecting the automation server with a plurality of input and output subassemblies and devices that send and receive signals between the automation server and an underlying physical process being controlled outside the automation server, said signals including actual process variables from the technical installation;
   wherein the automation server comprises a first software component designed to operate in a normal mode for implementation of the automation process on which the installation is based during operation of the control system, and also designed for a simulation mode, and having corresponding first interfaces, including an I/O interface that leads to the I/O bus system during normal operation, and other communication interfaces to communicate with other program parts of the control system, and
   a simulation system integrated with and running on the same platform as the control system, wherein the simulation system comprises three simulators,
   (a) an automation process simulator comprising the first software component of the control system further adapted to simulate the automation process,
   (b) a hardware simulator comprising a second software component designed to simulate the hardware of the peripherals and input and output subassemblies and devices of the control system with its connections, and
   (c) a process simulator comprising a third software component designed to simulate the physical process on which the installation is based,
   wherein the first, second, and third software components are combined to form a single execution environment in the form of an execution container with container-internal connections to each other for communication, and
   wherein the single execution environment provides for automation process simulation, hardware simulation, and process simulation to take place in one execution environment and on the same platform as the control system when changed from the normal mode to the simulation mode.

15. The integrated system of claim 14, wherein the communication interfaces continue provide communication between the single execution environment and other program parts of the control system when the first execution environment or parts therefore is/are in the simulation mode.

16. The integrated system of claim 14, wherein the single execution environment comprises embedded software components and representative modules of individual software components.

* * * * *